(12) United States Patent
Tauchi et al.

(10) Patent No.: US 6,452,085 B2
(45) Date of Patent: Sep. 17, 2002

(54) THERMOELECTRIC DEVICE

(75) Inventors: Hitoshi Tauchi, Anjo; Satoru Ogawa, Okazaki; Hirotsugu Sugiura, Hekinan; Noburo Ebina, Tokyo, all of (JP)

(73) Assignee: Aisin Seiki Kabushiki Kaisha, Kariya (JP)

( * ) Notice: Subject to any disclaimer, the term of this patent is extended or adjusted under 35 U.S.C. 154(b) by 0 days.

(21) Appl. No.: 09/760,852

(22) Filed: Jan. 17, 2001

(30) Foreign Application Priority Data

Jan. 17, 2000 (JP) ........................................ 2000-007701

(51) Int. Cl.⁷ .............................................. H01L 35/28
(52) U.S. Cl. ........................ 136/203; 136/205; 136/237; 252/62.3 T
(58) Field of Search ................................ 136/203, 205, 136/237; 252/62.3 T

(56) References Cited

U.S. PATENT DOCUMENTS 5,429,680 A * 7/1995 Fuschetti .................... 136/203
6,103,967 A * 8/2000 Cauchy et al. ............. 136/201

OTHER PUBLICATIONS

Realize Company, Thermoelectric Transfer System Technical General Handbook, pp. 24–25, "Chapter 2: Composition and Design Theory of Thermoelectric Transfer System", Jun. 30, 1995 (with English translation).

* cited by examiner

*Primary Examiner*—Nam Nguyen
*Assistant Examiner*—Thomas H. Parsons
(74) *Attorney, Agent, or Firm*—Oblon, Spivak, McClelland, Maier & Neustadt, P.C.

(57) ABSTRACT

A thermoelectric device includes a thermoelectric element composed of principally thermoelectric material, a counter element adhered to the thermoelectric material. A solder layer lies between the thermoelectric element and the counter element and adheres the thermoelectric element to the counter element. A restraining layer prevents the solder ingredient of the solder layer from spreading into the thermoelectric element. The restraining layer is composed of a first layer to prevent the solder ingredient of the solder layer from spreading into the thermoelectric element and a second layer composed of material having a higher wetting property than the first layer with respect to the solder layer.

8 Claims, 1 Drawing Sheet

THERMOELECTRIC DEVICE

BACKGROUND OF THE INVENTION

1. Field of the Invention

The present invention relates to a thermoelectric device comprising a thermoelectric element composed of principally thermoelectric material.

2. Description of the Prior Art

A thermoelectric device comprising a thermoelectric element principally composed of thermoelectric material is well known. The known thermoelectric device has two types of usages, one is as a cooling-heating type device which can cool or heat when electricity is supplied, and the other is as a power generation type which can generate electricity when being cooled or heated.

A known conventional thermoelectric device is disclosed in pages 24 to 25 of "Thermoelectric Transfer System Technical General Handbook" published by Realize Company on Jun. 30, 1995 (heisei 7). The nickel plating layer of this device prevents the solder ingredient of the solder layer from spreading into the thermoelectric element, and consists of a single layer. Therefore, the conventional thermoelectric device has advantages of long life and reduced degradation in use.

Furthermore, in general, the thermoelectric element composed of thermoelectric material is hard to solder. The nickel plating layer prevents the solder ingredient of the solder layer from spreading into the thermoelectric element, and degrades the soldering characteristic of the thermoelectric element when the thermoelectric element is assembled.

Increased restraint of the spread of the solder ingredient together with improved soldering are desired in the industry. However, a single layer nickel plating is inadequate for combining the characteristics of improved spread prevention and improved soldering. In other words, if the nickel plating layer is designed for a high level of spread prevention, it can prevent the solder ingredient of the solder layer from spreading the inside of the thermoelectric element, but then it has an insufficient solder wetting property. On the other hand, if the nickel plating layer is designed for a high solder wetting property, it is sufficient for spread prevention.

An object of the present invention is to solve the above-mentioned disadvantages, and more specifically, to provide a thermoelectric device having both a high soldering property and high spread prevention.

SUMMARY OF THE INVENTION

According to a feature of the present invention, the above and other objects are addressed by a thermoelectric device comprising a thermoelectric element composed of principally thermoelectric material, a counter element adhered to said thermoelectric material, a solder layer lying between said thermoelectric element and said counter element and adhering said thermoelectric element to said counter element, and a restraining layer located between said thermoelectric element and said solder layer, wherein said restraining layer comprises a first layer having a composition to prevent said solder ingredient of said solder layer from spreading into said thermoelectric element, and a second layer composed of material having a higher wetting property than said first layer with respect to said solder layer.

BRIEF DESCRIPTION OF THE DRAWINGS

The above and other objects, features and advantages of the present invention will be more apparent and more readily appreciated from the following detailed description of preferred exemplary embodiments of the present invention, taken in connection with the accompanying drawings, in which.

DESCRIPTION OF A PREFERRED EMBODIMENT

Figure 1:
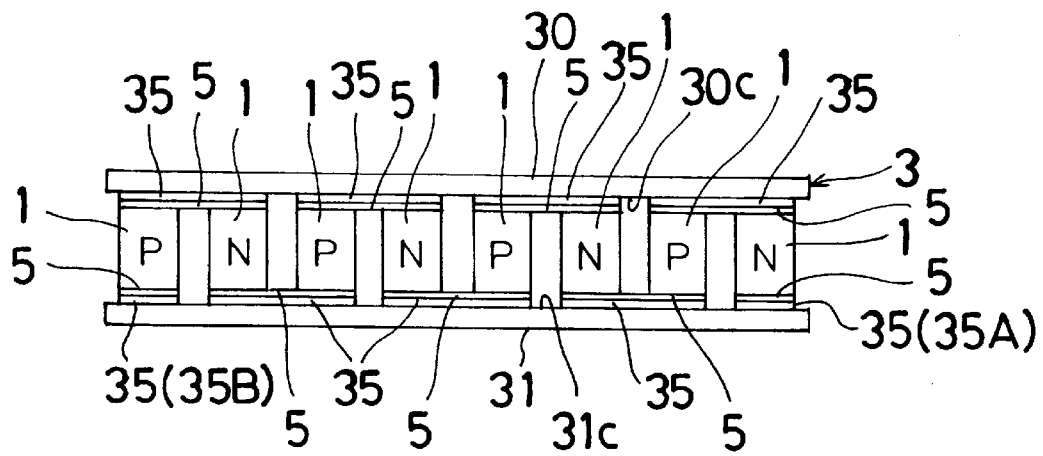
FIG. 1 is a schematic front view of a thermoelectric device according to an embodiment of the present invention.

According to the present invention, the thermoelectric material for the thermoelectric device is at least one of a bismuth-tellurium series, a bismuth-selenium series, and an antimony-tellurium series, an antimony-selenium series, a bismuth-tellurium-antimony series, and a bismuth-tellurium-selenium series. Specifically, it is at least one of selected from $Bi_2Te_3$, $Bi_2Se_3$, $Sb_2Te_3$, $Sb_2Se_3$. Bismuth-tellurium-antimony series is selected for a thermoelectric device of P-type (positive type). Bismuth-tellurium series and bismuth-tellurium-selenium series are selected for a thermoelectric device of N-type (negative type).

According to the present invention, the counter element adhered to the thermoelectric element is a substrate having an electrode. A ceramic substrate may be employed for the substrate. A ceramic material of the substrate is selected from an alumina series, an aluminum nitride series, a beryllia (BeO) series, and a silicon carbide series etc. The solder may be selected from a bismuth-tin series, a tin-antimony series, a lead-tin series, a lead-tin-bismuth series, a tin series, and a lead series etc., but the solder is not limited to the aforementioned series.

According to the present invention, the restraining layer comprises a first layer to prevent the solder ingredient of the solder layer from spreading into the thermoelectric element and a second layer composed of material which has a higher wetting property relative to the solder layer than does the first layer. The first layer is a non-electrolytic plating layer composed of a nickel-phosphorus series, or a non-electrolytic plating layer composed of a nickel series. The second layer has a high wetting property against the solder. The second layer comprised a non-electrolytic plating layer composing of a nickel-boron series. A non-electrolytic plating layer composed of nickel-boron series is slower in the plating speed and more expensive to manufacture than a non-electrolytic plating layer composed of a nickel-phosphorus series. However, nickel-boron has an excellent wetting property relative to the solder when soldering, so that the soldering characteristic of the thermoelectric device is improved.

A non-electrolytic plating layer composed of a nickel-phosphorus series is a little lower in its wetting property, but is faster in the plating speed and cheaper to manufacture than a non-electrolytic plating layer composing of a nickel-boron series.

A non-electrolytic plating layer composed of nickel-phosphorus series is produced by a plating bath including, but not limited to, nickel-chloride or hydrosulfate, with sodium hypophosphite as the reducer. A non-electrolytic plating layer composed of a nickel-boron series is produced by a plating bath including, but not limited to, nickel-chloride or hydrosulfate with boron hydroxylase as the reducer.

In some cases, the first layer and the second layer are not limited by non-electrolytic plating, and these can be produced by electroplating of nickel metal etc.

According to the present invention, the average thickness of the first layer is thicker than that of the second layer to increase the spread prevention effect at low cost since it can be made by a short time process. Though the ratio of the average thickness between the first layer and the second layer is varied by consideration of manufacturing speed or manufacturing cost under usable conditions, it may be set as "the average of the first layer:the average of the second layer=1:(1 to 300)". Preferably, it may be set as "the average of the first layer:the average of the second layer=1:(1 to 100)". More preferably, it may be set as "the average of the first layer:the average of the second layer=1:(2 to 10)". However, the present invention is not so limited.

A ratio of the raw value of the average thickness between the first layer and the second layer is varied by consideration of manufacturing speed, manufacturing cost under usable conditions, or material of the first layer or the second layer etc. Accordingly, in some cases, for example, the average of the first layer is set as 0.2 to 50 $\mu$m, 0.5 to 20 $\mu$m, 1.0 to 15 $\mu$m, 1.0 to 10 $\mu$m, and 5 to 10 $\mu$m etc. The average of the second layer is set as 0.04 to 10 $\mu$m, 0.8 to 5 $\mu$m, 0.1 to 1.0 $\mu$m, and 0.1 to 0.5 $\mu$m etc. However, the present invention is not limited by the aforementioned ratios.

Embodiment Example

Preferred embodiments of the present invention will be described hereinafter in detail with reference to the accompanying drawings.

Figure 2:
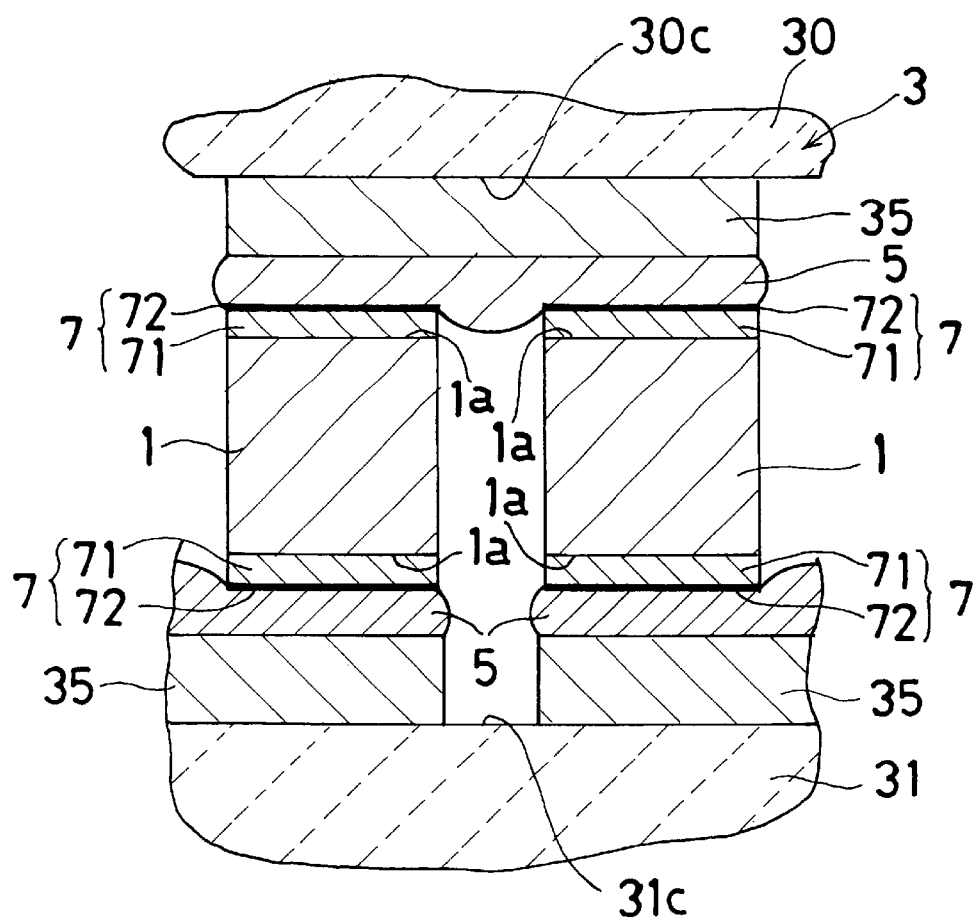
FIG. 2 is a schematic cross sectional view of a substantial part of a thermoelectric device according to the embodiment of the present invention.

FIG. 1 is a schematic front view of a thermoelectric device according to the embodiment of the present invention. FIG. 2 is schematic cross sectional view of a thermoelectric device according to the embodiment of the present invention. As shown in FIG. 1, the thermoelectric device related to the present invention comprises thermoelectric modules which are made of the thermoelectric element 1, and the counter element 3 countering the element 1. A solder layer 5 adheres the thermoelectric element 1 and the counter element 3 to each other.

The counter element 3 comprises a pair of insulating ceramic substrate (material:alumina) 30, 31 having the planes 30c, 31c for mounting the elements countered each other, and the conductive electrodes (material:copper) 35 lain between said planes 30c, 31c and the solder layer 5. The solder layers 5 are composed of conductive and low melt point metal, for example a tin-antimony alloy.

The thermoelectric material of the thermoelectric element 1 converts electric energy into heat energy, or heat energy into electric energy, and is composed of one selected from a bismuth-tellurium series, a bismuth-selenium series, an antimony-tellurium series, and a antimony-selenium series. The aforementioned thermoelectric material has naturally poor wetting property against the solder when soldering. Furthermore, when used for a thermoelectric device, the solder ingredient of the solder layer 5 is apt to spread into the thermoelectric element 1 by heat-influences. If the thermoelectric device is used for a long time, the spread brings about the degradation of the thermoelectric element 1 and conductive defects.

According to the present invention, in order to improve the characteristic of soldering and prevent the degradation of the thermoelectric element 1 due to the spread of the solder ingredient, the restraining layer 7 lies between the thermoelectric element 1 and solder layer 5, as shown in FIG. 2, to prevent the solder ingredient of the solder layer 5 from spreading into the thermoelectric element 1.

The restraining layer 7 of the present invention comprises two-layer composition of a first layer 71 (the average thickness: 0.5 to 10.0 $\mu$m) and the second layer 72 (the average thickness: 0.1 to 1.0 $\mu$m). The first layer 71 has a conductive characteristic, and a main object of the first layer 71 is to prevent the solder ingredient of the solder layer 5 from spreading into the thermoelectric element 1. Furthermore, the first layer 71 lies between the end face 1a of the thermoelectric element 1 and the second layer 72, so that it directly contacts the end face 1a of the thermoelectric element 1 which is the physical object to be protected from the spreading phenomenon. Specifically, the first layer 71 comprises a non-electrolytic plating layer composed of a nickel-phosphorus series. The average thickness of the first layer 71 is thicker than that of said second layer 72.

The second layer 72 has conductive characteristic, and a main object of the second layer 72 is to provide a better wetting property against the solder layer than said first layer 71 when soldering. Therefore, the second layer 72 lies between the solder 5 and the first layer 71 so that it directly contacts a solder layer 5. Accordingly, the second layer 72 has a better wetting property than the first layer 71 against the solder. Specifically, the second layer 72 comprises a non-electrolytic plating layer composed of a nickel-boron series.

As shown in FIG. 1, the P-type and N-type thermoelectric elements 1 are respectively labeled as "P" and "N". When the thermoelectric device is used, the electrode 35A (35) of one end is connected to a positive pole of a power supply, and that of the other end is connected to a negative pole of a power supply, so that electric power is fed between the positive pole and the negative pole of the power supply through the plural thermoelectric elements including the electrodes 35B (35). Therefore, the substrate 30 of the one side is cooled to be the low temperature side, and the substrate 31 of the other side is heated to be the high temperature side, due to the thermoelectric effect of each thermoelectric element. Alternatively, the low temperature and the high temperature sides are reversed when switching the positive pole and the negative pole to feed electric power in the reverse direction.

The thermoelectric device shown in FIG. 1 and FIG. 2 was used as a test piece. The first layer 71 composed of the non-electrode nickel-phosphorus plate layer (phosphorus, 2 to 8 wt %) was laminated on the both ends 1a of the thermoelectric element 1 by a first non-electrode plating process. Furthermore, a second layer 72 composed of the non-electrode nickel-boron plate layer (boron, 1 wt %) was laminated on the first layer 71 by a second non-electrode plating process.

Three samples of the first layer 71 were prepared with thicknesses of 0.5 to 1.0 $\mu$m, 1.0 to 5.0 $\mu$m and 5.0 to 10.0 $\mu$m. Two samples of the second layer 72 were prepared with thickness of 0.1 to 0.5 $\mu$m and 0.5 to 1.0 $\mu$m.

In order to evaluate defects of soldering, a burn-in test which fed an electric current of 2 amps to each test piece was performed. After the burn-in test, a cool-heat was performed, in which the test pieces were held at a temperature of −40° C., for 15 minutes and at a temperature of 80° C. for 15 minutes. The variation ratio of the internal electrical resistance of the test pieces was measured before and after the burn-in test and the cool-heat test. If the variation ratio of internal electrical resistance is not more than 0.5%, the test piece is evaluated as an acceptable product. If the variation ratio of the internal electrical resistance exceeds 0.5%, the test piece is evaluated as a non-acceptable products. A total of 30 test pieces were prepared, and the rate of occurrence of non-acceptable products among the thirty (30) test pieces was calculated.

Furthermore, comparative example test pieces were tested by the high temperature exposure test, whereby the temperature of the test pieces was maintained at 150° C. The variation ratio of the internal electrical resistance of these comparative test pieces was measured before and after the high temperature exposure test. If the variation ratio of the internal electrical resistance is not more than 10%, the test piece is evaluated as an acceptable product. If the variation ratio of the internal electrical resistance exceeds 10%, the test piece is evaluated as a non-acceptable product. A total of 22 test pieces were so prepared, and the rate of occurrence for non-acceptable products among the 22 test pieces was calculated.

Table 1 shows the results of the evaluations.

In the same way as in the embodiment example, in the test pieces related to the comparative example 1, the first layer 71 composed of non-electrode nickel-phosphorus plate was laminated with a thickness of 1.0 to 5.0 μm on the ends of the thermoelectric elements 1. The thermoelectric device was produced in the same way as above-mentioned, and was evaluated in the same way as the above-mentioned test example. As the test piece related to the comparative example 2, the first layer 71 composed of the non-electrode nickel-phosphorus plate was laminated with a thickness of 0.5 to 1.0 μm on the end of the thermoelectric element 1. The thermoelectric device was produced in the same way as above-mentioned, and was evaluated as the same way of as the above-mentioned test example.

Regarding the test pieces of the comparative example 1 and the comparative example 2, the first layer 71 composed of non-electric nickel-phosphorus plate was laminated, but the second layer 72 composed of non-electric nickel-boron plate was not laminated.

Table 1 also shows results of the evaluation concerning the comparative example 1 and the comparative example 2.

Regarding the test piece related to the embodiment example, the second layer 72 composed of the non-electric nickel-boron plate layer with good wetting property against the solder is laminated on the first layer 71 composed of the non-electrode nickel-phosphate plate layer with the high spread prevention property. Therefore, this embodiment example had the spread property to prevent solder ingredient from spreading into the thermoelectric element 1, and had improved soldering characteristic for electrode 35 and thermoelectric element 1, and had restrained degradation of the test piece after each test. Consequently, as understood from Table 1, according the test pieces from the embodiment example, the rate of occurrence of defective test pieces was zero or extremely low.

As shown in Table 1, under the aforementioned test condition, when the thickness of the first layer 71 was 0.5 to 1.0 μm, the rate of occurrence of defective test pieces after the high temperature exposure test was 3/22 (three per twenty-two). Considering this result, under the aforementioned test condition, the preferable thickness of the first layer 71 is no less than 1.0 μm. Furthermore, if the test condition of the thermoelectric device is expanded, the thickness of the first layer 71 of no more than 1.0μ is satisfactory as a non-defective test piece.

According to the present invention, when the first layer is a non-electrolytic plating layer composed of nickel-phosphorus series, and the second layer is non-electrolytic plating layer composed of a nickel-boron series, the present invention is able to achieve a good effect.

According to the present invention, when the average thickness of the first layer is thicker than that of said second layer, the solder ingredient is effectively prevented from spreading into the thermoelectric element. Especially when the average thickness of the first layer composed of a nickel-phosphorus series is thicker than that of the second layer composed of a nickel-boron series, the present invention may efficiently achieve the spread prevention effect, may increase the productivity and may achieve low cost in manufacturing due to the thinness of the non-electrolytic plating layer composed of a nickel-boron series whose plating speed is slow and expensive in manufacturing.

What is claimed is:

1. A thermoelectric device comprising:
   a thermoelectric element composed of principally thermoelectric material,
   a counter element adhered to said thermoelectric material,
   a solder layer lying between said thermoelectric element and said counter element and adhering said thermoelectric element to said counter element, and
   a restraining layer located between said thermoelectric element and said solder layer, wherein said restraining layer comprises a first layer having a composition to prevent the solder ingredient of said solder layer from spreading into said thermoelectric element, and
   a second layer composed of material having a higher wetting property than said first layer with respect to said solder layer.

2. A thermoelectric device according to claim 1 wherein said first layer is a non-electrolytic plating layer composed of a nickel-phosphorus series, and said second layer is a non-electrolytic plating layer composed of a nickel-boron series.

3. A thermoelectric device according to claim 1 wherein the average of the thickness of said first layer is thicker than that of said second layer.

4. A thermoelectric device according to claim 2 wherein the average of the thickness of said first layer is thicker than that of said second layer.

TABLE 1

|  | Embodiment example | | | | | | Comparative Example 1 | Comparative Example 2 |
|---|---|---|---|---|---|---|---|---|
| Second layer Ni-B Thickness (μm) |  | 0.1~0.5 |  |  | 0.5~1.0 |  | — | — |
| First layer Ni-P Thickness (μm) | 0.5~1.0 | 1.0~5.0 | 5.0~10.0 | 0.5~1.0 | 1.0~5.0 | 5.0~10.0 | 1.0~5.0 | 0.5~1.0 |
| Defect ratio after the burn-in test and the cool-heat test | 0/30 | 0/30 | 0/30 | 0/30 | 0/30 | 0/30 | 4/30 | 5/30 |
| High temperature exposure test Defect ratio after 30-hours | 3/22 | 0/22 | 0/22 | 0/22 | 0/22 | 0/22 | 0/22 | 9/22 |
| High temperature exposure test Defect ratio after 10-hours | 0/22 | 0/22 | 0/22 | 0/22 | 0/22 | 0/22 | 0/22 | 2/22 |

5. A thermoelectric device comprising:

a thermoelectric element composed of principally thermoelectric material, a counter element adhered to said thermoelectric material, a solder layer lying between said thermoelectric element and said counter element and adhering said thermoelectric element to said counter element, and a restraining layer located between said thermoelectric element and said solder layer, wherein said restraining layer comprises a first layer comprising means for preventing the solder ingredient of said solder layer from spreading into said thermoelectric element, and a second layer comprising means having a higher wetting property than said first layer with respect to said solder layer.

6. A thermoelectric device according to claim 5 wherein said first layer is a non-electrolytic plating layer composed of a nickel-phosphorus series, and said second layer is non-electrolytic plating layer composed of a nickel-boron series.

7. A thermoelectric device according to claim 5 wherein the average of the thickness of said first layer is thicker than that of said second layer.

8. A thermoelectric device according to claim 6 wherein the average of the thickness of said first layer is thicker than that of said second layer.

* * * * *